United States Patent [19]

Michelsen

[11] Patent Number: 5,387,824
[45] Date of Patent: Feb. 7, 1995

[54] VARIABLE DRIVE OUTPUT BUFFER CIRCUIT

[75] Inventor: Jeffery M. Michelsen, Mesa, Ariz.

[73] Assignee: VLSI Technology, Inc., San Jose, Calif.

[21] Appl. No.: 718,735

[22] Filed: Jun. 21, 1991

Related U.S. Application Data

[63] Continuation-in-part of Ser. No. 444,478, Dec. 1, 1989.

[51] Int. Cl.6 ............................................. H03K 17/16
[52] U.S. Cl. .................................... 326/83; 326/21; 327/111
[58] Field of Search ................. 307/270, 443, 465, 542

[56] References Cited

U.S. PATENT DOCUMENTS

| | | | |
|---|---|---|---|
| 4,719,369 | 1/1988 | Asano et al. | 307/443 |
| 4,731,553 | 3/1988 | Van Lehn et al. | 307/443 |
| 4,749,884 | 6/1988 | Karban et al. | 307/270 |
| 4,820,942 | 4/1989 | Chan | 307/542 |
| 4,855,623 | 8/1989 | Flaherty | 307/270 |

Primary Examiner—Edward P. Westin
Assistant Examiner—Andrew Sanders
Attorney, Agent, or Firm—LaValle D. Ptak

[57] ABSTRACT

A variable drive output buffer circuit for use to drive memory address lines, or the like, in a computer system has the drive output connected in parallel to a group of output buffer drive circuits, each of which is supplied with the drive signal. Each of the output buffer drive circuits, preferably in the form of CMOS buffer circuits, is selectively individually enabled or disabled to select the optimum number of output drive circuits which are operated in parallel to supply the drive signal to the output bonding pad. All of the disabled drive circuits are placed in a high impedance state, so that they essentially are removed from the circuit and do not affect the total drive capability.

8 Claims, 2 Drawing Sheets

VARIABLE DRIVE OUTPUT BUFFER CIRCUIT

This is a continuation-in-part of application 07/444,478 filed Dec. 1, 1989.

BACKGROUND

Computer systems employ memory address lines which are provided with drive signals in conjunction with the operation of the memories. Memory address signals typically have a very high capacitance load, so that the output buffer for the drive signal must be matched to that load. Even for computers of the same type, the load, however, varies significantly depending upon how much memory is installed in the computer system. A similar load variation occurs for systems with expansion bus provisions.

If the drive signal on the output pad of the integrated circuit providing the memory address drive signal or a bus drive signal is designed to drive the highest capacitive load which may be connected to such an output pad, the signal will be much too strong for the smallest possible capacitive load which could be connected to such an output pad. Obviously, if a system is custom designed and fixed in size, exact matching can be accomplished. The problem, however, exists when the drive circuit is separately manufactured from the memory or bus cards installed in the computer. If the circuit provides a signal which is capable of driving a high capacitive load, such a signal can cause major problems, such as undershoot, ringing and sharp edges for signals applied to small capacitive loads connected to the output bonding pad of the drive circuit.

If the output bonding pad of the drive circuit is designed drive a capacitive load which is between the lowest and highest loads which may be connected to the bonding pad, the signal is too weak for the highest load and still too strong for the smallest load which may be encountered by the drive system. This mismatching again causes problems with the signals applied to the memory address inputs of the computer.

In the past, attempts to solve this problem utilized external buffer circuits to split the capacitive load. This results in additional parts on the circuit board. More power is consumed by the extra parts, and more signals must be routed on the circuit board to direct the signals to the external buffering circuits, In addition, an increased number of signal transitions occur. This inherently causes a noisier environment to exist. Although the necessary matching of the memory address signals to the load of the memory address line of the computer is accomplished with such external buffering, it is not efficiently and efficiency and effectively accomplished because of the above-mentioned disadvantages.

A system which is custom designed to exactly match the load connected to the output pad of the driver has been developed. That system is disclosed in the patent to Asano No. 4,719,369 and is used to "trim" the size of the output buffer to match the pre-established characteristic impedance of a specified impedance transmission line. The buffer is designed to work with a single impedance load, and is not designed to be used with loads having wide range of different impedances. The trimming is accomplished as an internal function of the chip, of which the output buffer amplifiers are a part. The trimming compensates for internal variations, such as voltage, temperature, and process, as these internal variations affect the output circuit part.

To accomplish the internal trimming automatically, the prior art system mentioned above employs four parallel-connected CMOS output buffer amplifiers. The gate width of the transistors in the buffer amplifiers of Asano are constructed, physically, with a ratio of 8:4:2:1. Resistors are fabricated on the chip with the buffer amplifiers to vary in impedance in accordance with voltage and temperature variation to which the chip is exposed. Gate width control circuits sense the variations of the voltages across these control resistors to automatically enable or disable different ones of the output buffer amplifiers to effect the desired trimming to match the output drive characteristics of the circuit with the pre-established impedance of the load to which it is connected. The circuit is fixed in size to initially establish, and to maintain during operation, the exact impedance matching for a particular load. If such a circuit or device, however, were to be installed in a computer to drive a load different from the pre-established load for which it is designed, serious impedance mismatch would occur, since the trimming, which is effected by the Asano system, would not track or follow the variations of such a different load. No independent control of the enabling or disabling of the various parallel connected buffer amplifier circuits is provided.

Consequently, it is desirable to provide a drive signal on an integrated circuit board which may be configured to drive a variable amount of capacitive load without causing undue noise in the system or degrading the speed of the signal.

SUMMARY OF THE INVENTION

It is an object of this invention to provide an improved output buffer drive for integrated circuits.

It is an additional object of this invention to provide an improved variable output buffer drive circuit.

It is another object of this invention to provide an improved variable output buffer drive for CMOS integrated circuits.

It is a further object of this invention to provide an improved variable CMOS output buffer drive circuit consisting of a number of output buffers connected in parallel between an input terminal and an output bonding pad, with a provision for selectively and independently disabling such output buffers to vary the total drive capabilities.

In accordance with a preferred embodiment of this invention, an output buffer circuit is interconnected between a binary signal input terminal and an output terminal. The buffer circuit includes a plurality of identical CMOS circuits, each having first and second complementary inputs connected to the input terminal, and each having an output connected in common with the output terminal. A plurality of an enabling circuit devices are provided, each corresponding to a different respective one of the CMOS circuits to selectively and independently enable and disable the associated CMOS circuits to respond to the signals on the signal input terminal. The enabling circuit devices, in turn, are controlled by manual or software controlled logic to select the number of CMOS circuits required for matching the load connected to the output terminal.

DETAILED DESCRIPTION

Figure 1:
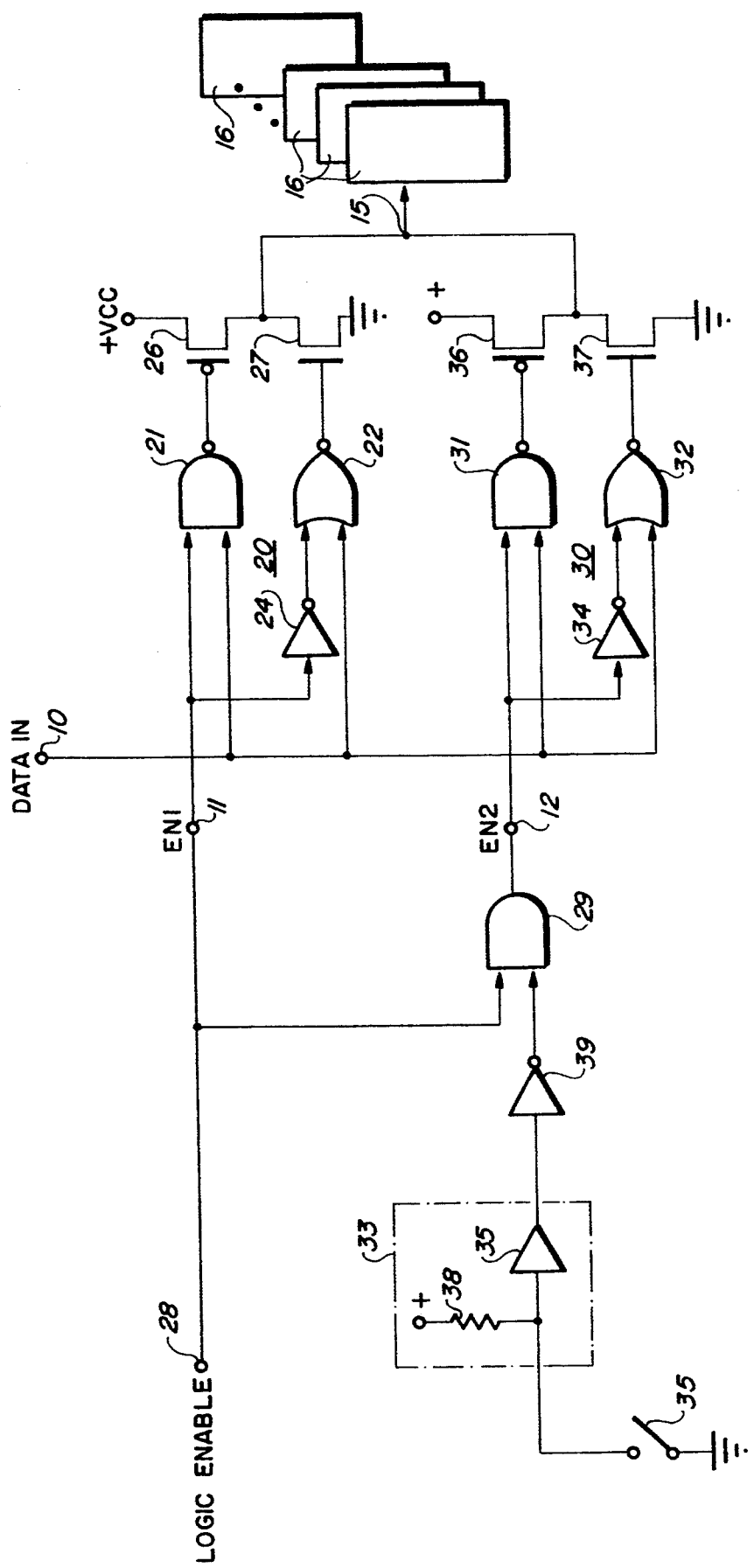
FIG. 1 of the drawing is a schematic circuit diagram of a preferred embodiment of the invention.

Reference now should be made to the drawing which discloses two preferred embodiments of the invention. The circuit shown in FIG. 1 of the drawing is an expansion bus drive circuit, and FIG. 2 shows the output buffer stage of a memory address drive circuit formed as a part of a larger integrated circuit system.

Figure 2:
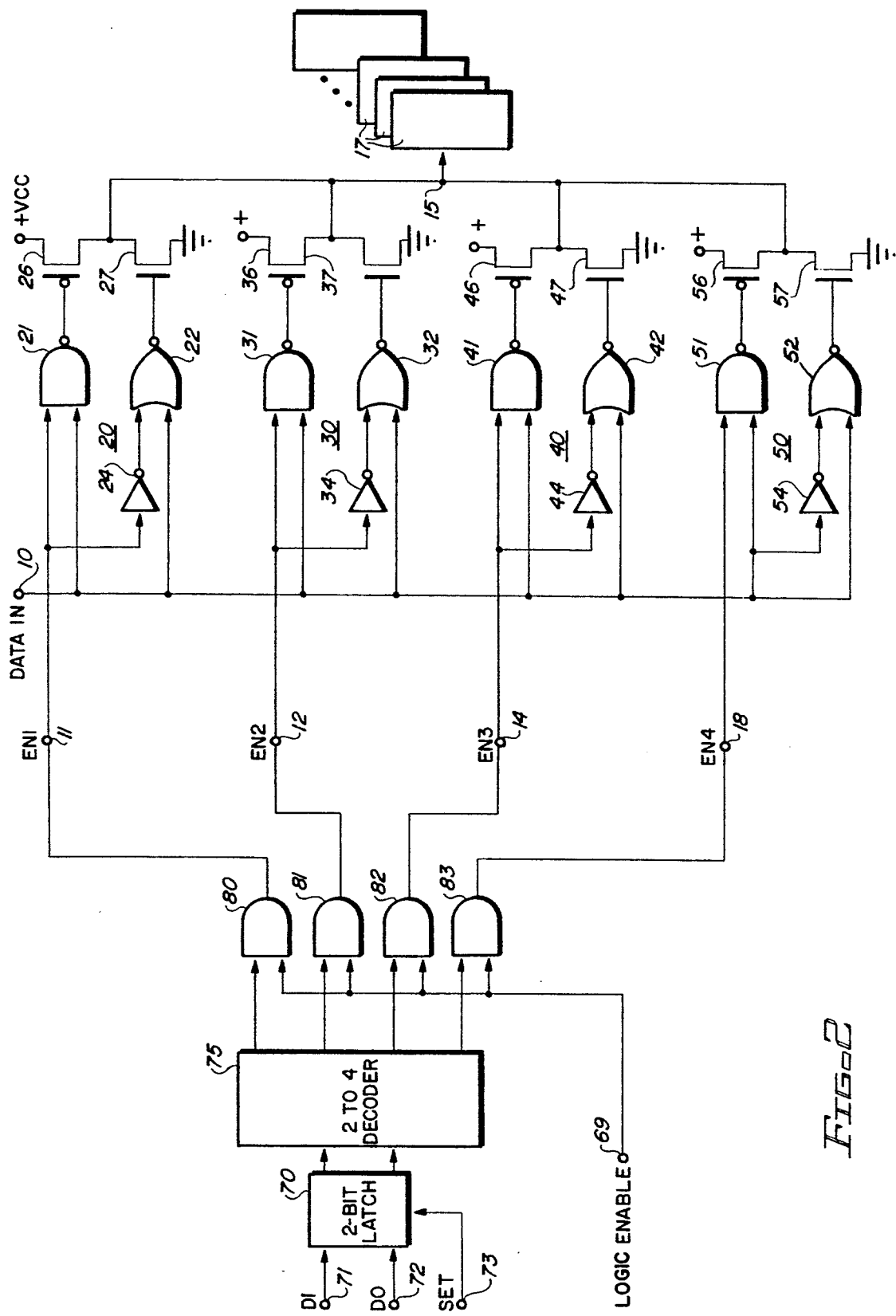
FIG. 2 is a schematic circuit diagram of another embodiment of the invention.

As illustrated in both FIGS. 1 and 2, input signals, such as memory address signals, are applied to an input terminal 10. These signals are coupled through the circuits shown in both figures of the drawing to an output 15. The output 15 then may be connected to an expansion bus (FIG. 1) or to a memory address line (FIG. 2) in a computer system in a conventional manner.

As described in the above "background" portion, expansion bus lines and memory address lines of a computer constitute high capacitive loads, which can vary significantly depending upon the amount of bus cards or memory installed in the system connected to the output 15. For any given application, however, the capacitive load is constant. Therefore, once the load which is to be connected to the output 15 is known, the magnitude of the drive signal required readily can be determined. When this is done, the circuits shown in the drawing are configured to produce a drive signal to the output 15 of proper magnitude to drive the particular number of bus cards or the memory address signal line which is connected to the output 15.

To accomplish the result mentioned above, the circuit shown in FIG. 1 includes two parallel CMOS output buffer amplifier circuits, each having an output connected in common to the output 15. Each of these output buffer amplifiers comprises a pair of CMOS devices, such as the MOS transistors 26 and 27 of the upper buffer amplifier circuit, connected in series. The source-drain conduction path of the P-channel MOS device 26 is connected in series with the source-drain conduction path of the N-channel MOS device 27 at the drains of the two MOS devices 26 and 27. A second buffer amplifier circuit is interconnected in parallel with the circuit 26/27 in common to the output pad 15. This second buffer circuit comprises a pair of CMOS transistors 36 and 37. The interconnections of the pair of transistors 36 and 37 and their operation are identical to the interconnections and operations of the transistors 26 and 27 in the upper stage of the circuit shown in the drawing.

Typically, binary data input signals appearing on the data input terminal 10 would be applied directly in common to the gates of the CMOS pairs, such as the devices 26,27 and 36,37. The output signal then appearing on the pad 15 would reflect the binary condition of the input signal on the terminal 10, since only one or the other of the MOS devices 26 or 27, and 36 or 37 would be rendered conductive at any given time in accordance with the binary state of the signals on the terminal 10.

In the circuit shown in FIG. 1, however, both of the output buffer amplifiers is coupled to the input terminal 10 through a separate enable circuit. This is done to permit one or both of the output buffer amplifiers to be selectively enabled to respond to the input signals occurring on the input terminal 10. For the CMOS buffer amplifier 26, 27, the enable circuit 20 comprises a NAND gate 21 connected to the gate of the MOS device 26 and a NOR gate 22 connected to the gate of the MOS device 27. The input terminal 10 is connected in common to one of the two inputs of each of the gates 21 and 22.

A separate independent enable terminal 11 is connected directly to the second input of the NAND gate 21 and through an invertor 24 to the second input of the NOR gate 22. A similar enable circuit 30 is provided for the other output buffer amplifier stage of the circuit shown in FIG. 1. The circuit 30 includes a NAND gate 31, a NOR gate 32 and an invertor 34 coupled to an enable signal input terminal 12. The operation of each of the enable circuits 20 and 30 is identical, and they are operated independently of one another.

Whenever the enable signal on either of the enable signal input terminals 11 or 12 is a high or a binary "1", the corresponding NAND gate (21, 31) and NOR gate (22, 32), both are enabled to respond to the input signals appearing on the input terminal 10. For example, a positive input on the enable terminal 11 causes the NAND gate 21 to respond to positive or "high" inputs on the input terminal 10. Whenever both of these signals are positive or high, the output of the NAND gate 21 is "low" to render the P-channel MOS device 26 conductive. This is also true for the other output buffer amplifier which is enabled with a "high" signal on the enable input terminal 12.

At the same time, the NOR gate 22 is enabled by an inverted signal passed through an invertor 24 to cause a low signal to be applied to the enable input of the NOR gate 22. The NOR gate 22, however, produces a "low" signal on its output in response to the "high" signal appearing on the input terminal 10. Thus, the N-channel MOS device 27 is non-conductive in the example given.

If the enable circuit 20 is enabled by a "high" signal on the terminal 11, as described above, and the input signal on the terminal 10 switches to a binary "0" or a "low" signal, the output of the NAND gate 21 remains "high", so that the P-channel MOS device 26 is non-conductive or functions as an open circuit. At the same time, however, both of the signals applied to the input of the NOR gate 22 are "low"; so that the output of the gate 22 goes "high" to drive the N-channel MOS device 27 to a conductive state.

The signal appearing on the output pad or terminal 15 correctly reflects the state of the input signal on the terminal 10. The strength of this signal, however, is determined by the number of output buffer amplifiers which are operative to drive the signal on the output pad 15 at any given time. For example, if the primary terminal 11 has a negative or a "low" signal on it, the NAND gate 21 is disabled and continuously produces a "high" signal on its output irrespective of the signal appearing on the input terminal 10. Similarly, the NOR gate 22 is provided with a "high" input from the output of the invertor 24 under this condition of operation; so that the output of the NOR gate remains continuously "low". This causes the N-channel MOS device 27, also to be rendered non-conductive. When both of the CMOS devices of the output buffer amplifier for any stage are non-conductive, they function essentially as an open circuit. Control of this primary enable signal is obtained from signals applied to a main logic enable terminal 28.

The operation which has been described specifically for the upper stage consisting of the enable circuit 20 and the CMOS output buffer amplifier 26, 27 is identically repeated for the other stage. Although only two (2) stages of output buffer amplifiers are shown as connected to the output pad 15 in FIG. 1, any number of stages may be utilized.

It is apparent from an examination of FIG. 1, that whenever a high or binary "1" enable signal appears on the logic enable terminal 28, the enable terminal 11 operates to permit the enable circuit 20 to respond to data input signals appearing on the terminal 10. The enable circuit 30, however, does not directly respond to the logic enable signal on the terminal 28, but is provided with enable signals on the terminal 12 from the output of an AND gate 29. One of the inputs to the AND gate 29 is obtained from the terminal 28. Thus, the AND gate 29 is prepared for supplying enable signals to the terminal 12 by the appearance of a binary "1" on the terminal 28. Whether or not the enable circuit 30 is provided with a positive signal to switch the CMOS devices 36 and 37 from a non-conductive stage selectively to a conductive stage, depends upon the application of an additional input signal to the AND gate 29. This signal is obtained, in the circuit of FIG. 1, from an input pin connected through a manually operated (or logic operated) switch 35 connected to ground. This input pin 33 has an internal pullup resistor 38 connected to the source of positive potential VCC. The junction between the switch 35 and the opposite end of the resistor 38 is connected to an amplifier 35 which drives an invertor 39 to supply the second input to the AND gate 29.

Implementation of the circuit to drive the widely varying load of different numbers of expansion bus cards 16 is determined by the user. The bus, connected to the output terminal 15, can have, typically, anywhere from zero to eight cards 16 plugged into it. The output 15 supplied from the CMOS output buffer amplifiers must be capable of driving this widely varying load. Whenever the logic enable terminal 28 is low or "0" both of the enable inputs 11 and 12 are low, and the outputs of the two CMOS buffer amplifier circuits 26, 27, and 36, 38 are normal tri-state (open circuits) or floating.

If only a few expansion bus cards 16 (four or less in the present example) are plugged into the slots of the computer, the user of the system shown in FIG. 1 leaves the switch 35 open. This causes a positive potential to be applied through the amplifier 35, which is inverted by the invertor amplifier 39 to cause a low or disabling potential to be applied to the lower input of the AND gate 29. Thus, the enable terminal 12 is "low" and the CMOS output buffer 36, 37 is in its floating or tri-state operation, and has no effect on the output signals appearing on the terminal 15. The upper circuit, consisting of the devices 26, 27, however, functions to respond to the input signals applied to the terminal 10 to supply drive signals to the terminal 15 for the expansion bus cards 16 connected to the terminal 15.

If a large number of expansion bus cards 16 (four to eight in the present example) are plugged into the slots, the user closes the switch 35. This causes a positive potential to be applied to the second input of the AND gate 29. Since the upper input is positive (the logic enable terminal 28 has a "high" signal on it), the enable terminal 12 also has a high enable signal applied to it; so that both of the CMOS buffer amplifier devices 26, 27, and 36, 37 operate together in parallel. This causes the full drive, both output amplifiers, of the system to be selected under this condition.

In place of manual operation of the switch 35, a circuit also can be designed to detect the actual number of cards in the expansion slots of the computer. Any time four or more cards are inserted into the expansion slots, the input pin 33 is forced low (effectively closing the switch 35), otherwise the input pin is forced high or remains high, in the same manner as described above when the manually operated switch 35 is open.

Reference now should be made to FIG. 2, which is a variation of the system shown in FIG. 1, expanded to four separate parallel connected buffer amplifiers 26,27; 36,37; 46,47; and 56,57. Each of these buffer amplifiers is selectively enabled to respond to input signals appearing on the data input terminal 10 through the operation of four identical separate enable circuits 20, 30, 40, and 50, respectively. Enable circuits 20 and 30 of FIG. 2 are identical to the corresponding enable circuits shown in FIG. 1, and operate in the same manner described in conjunction with the above description of the operation of the circuit of FIG. 1.

Similarly, the enable circuits 40 and 50 include NAND gates 41 and 51, respectively, NOR gates 42 and 52, respectively, and invertors 44 and 54, respectively coupled to enable signal input terminals 14 and 18 in the same manner as described above in conjunction with the enable input terminals 11 and 12 for the circuits 20 and 30. The operation of each of the enable circuits 20, 30, 40, and 50 is identical; and they are operated independently of one another in the same manner described above previously for the description of the operation of the circuits 20 and 30 in FIG. 1.

The enable signals applied to the terminals 11, 12, 14, and 18 of the circuit of FIG. 2, however, all are obtained, respectively, from the outputs of AND gates 80, 81, 82 and 83, similar to the AND gate 29 of FIG. 1. The main system logic enable signal of the circuit of FIG. 2 is applied to a logic enable terminal 69. Whenever this signal is low, all of the output buffer amplifiers of FIG. 2 are in their tri-state or nonconductive operation; and no output signals are applied to the terminal 15. When the logic enable signal applied to the terminal 69 is a binary "high" or "1", one of the two inputs to all four of the AND gates 80, 81, 82, and 83 is high; and these gates then are enabled for operation.

The second inputs to the AND gates 80 to 83 are obtained from a different one of four outputs of a two-to-four binary decoder circuit 75. Any of the four outputs from the circuit 75 may have a binary "high" or "1" signal on it, simultaneously with the other outputs. Thus, one, two, three, or all four of the gates 80, 81, 82, and 83 may receive "high" outputs from the decoder 75, depending upon the nature of the signals applied to the inputs of the decoder 75.

The two input signals to the decoder 75 are obtained from a two-bit latch circuit 70. The circuit 70 is software programmable, and has signals applied to two different inputs 71 and 72, and is triggered to store the selected inputs by input signals applied to a "set" terminal 73. The latch circuit 70, and the two-to-four decoder circuit 75 are standard digital circuits for performing the functions which have been described.

The circuit of FIG. 2 is used primarily when the output pad 15 may be required to drive anywhere from three to seventy-two different memory parts 17. In operation, the drive level required on the output pad 15 may be determined by a software routine run to determine how much system memory (memory parts 17) are installed. Based on this determination, the software then chooses the combination of drive signals applied to the terminals 71 and 72 for the two-bit latch 70 to program the latch 70 to supply the necessary output signals to the decoder 75.

Since the circuits 20, 30, 40, and 50 of FIG. 2 operate in the same manner described above for the operation of the circuits 20 and 30 of FIG. 1, it is readily apparent that one, two, three, or all four of the CMOS buffer output devices are enabled to respond to the data input signals appearing on the terminal 10. Thus, the input signals are applied in parallel through as many of the CMOS devices as are enabled for operation to the terminal 15 to effect the desired impedance matching of the drive circuit with the load (consisting of the memory parts 17) connected to the terminal 15.

It is readily apparent that whenever a high or binary "1" signal appears on any one of the enable terminals, such as the terminals 11, 12, 14, and 18 of FIG. 2, the corresponding CMOS output buffer amplifier is driven in accordance with the nature of the input signal appearing on the input terminal 10. One or more of the stages in parallel then provide the drive signal to the pad 15. Conversely whenever a binary "0" or "low" signal appears on the corresponding enable terminal, such as the terminals 11, 12, 14, or 18, the corresponding CMOS output buffer amplifier is rendered inoperative and is placed in a high impedance state, effectively removing such an amplifier from the circuit.

Various changes and modifications will occur to those skilled in the art without departing from the true scope of this invention, as defined in the appended claims.

I claim:

1. An output buffer circuit for matching the drive signal on an output terminal to the different impedance requirements of different loads externally connected to such terminal, said circuit including in combination:
   a binary signal input terminal;
   an output terminal;
   a plurality of CMOS buffer circuit means, each having first and second complementary inputs and each having an output, with the outputs of said plurality of CMOS buffer circuit means connected in common with said output terminal;
   coupling means for connecting said signal input terminal in common with the first and second inputs of each of said plurality of said CMOS buffer circuit means;
   a plurality of independent enable circuit means each connected to a different respective one of said plurality of CMOS buffer circuit means for selectively and independently enabling and disabling said CMOS buffer circuit means for responding to signals on said signal input terminal, each of said enable circuit means including first and second complementary logic coincidence gate means coupled, respectively, between the first and second inputs of each of said plurality of CMOS buffer circuit means and said signal input terminal;
   inverter circuit means;
   a separate enable signal input terminal for each of said enable circuit means connected directly to a first input of said first coincidence gate means and connected through said inverter circuit means to the first input of said second coincidence gate means, with said input signals being applied in common to all of said coincidence gate means in each of said enable circuit means; and
   means for selectively supplying separate predetermined independent enable signals to each of said separate enable input terminals according to predetermined different impedance requirements of different loads externally connected to said output terminal to cause different numbers of said CMOS buffer circuit means to be enabled for operation in parallel to respond to signals on said binary signal input terminal.

2. The combination according to claim 1 further including a source of operating potential, and wherein each of said CMOS buffer circuit means comprise complementary P and N MOS devices, the source-drain circuit paths of which are connected in series with one another across said source of operating potential, and the output of each CMOS buffer circuit means coupled with the common interconnected drains of said P and N MOS devices.

3. The combination according to claim 1 wherein said enable circuit means each provide signals of first and second signal levels, with signals at said first level enabling the corresponding CMOS buffer circuit means to respond to signals on said signal input terminal, and signals at said second level disabling such corresponding CMOS buffer circuit means.

4. The combination according to claim 1 wherein said buffer circuit means each comprise series-connected P and N MOS transistors connected between a source of positive potential and ground; said first coincidence gate means comprises an AND gate and said second coincidence gate means comprises a NOR gate.

5. The combination according to claim 1 wherein said plurality of CMOS buffer circuit means each are identical to one another, and each have identical operating characteristics to the others.

6. The combination according to claim 5 wherein said enable circuit means each provide signals of first and second signal levels, with signals at said first level enabling the corresponding CMOS buffer circuit means to respond to signals on said signal input terminal, and signals at said second level disabling such corresponding CMOS buffer circuit means.

7. The combination according to claim 6 further including a source of operating potential, and wherein each of said CMOS buffer circuit means comprise complementary P and N MOS devices, the source-drain circuit paths of which are connected in series with one another across said source of operating potential, and the output of each CMOS buffer circuit means coupled with the common interconnected drains of said P and N MOS devices.

8. The combination according to claim 7 wherein said buffer circuit means each comprise series-connected P and N MOS transistors connected between a source of positive potential and ground; said first coincidence gate means comprises an AND gate and said second coincidence gate means comprises a NOR gate.

* * * * *